(12) United States Patent
Lee

(10) Patent No.: US 9,716,199 B2
(45) Date of Patent: Jul. 25, 2017

(54) SOLAR CELL APPARATUS

(71) Applicant: LG INNOTEK CO., LTD., Seoul (KR)

(72) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/382,649

(22) PCT Filed: Mar. 5, 2013

(86) PCT No.: PCT/KR2013/001729
§ 371 (c)(1),
(2) Date: Sep. 3, 2014

(87) PCT Pub. No.: WO2013/133589
PCT Pub. Date: Sep. 12, 2013

(65) Prior Publication Data
US 2015/0171252 A1 Jun. 18, 2015

(30) Foreign Application Priority Data

Mar. 5, 2012 (KR) .................. 10-2012-0022315

(51) Int. Cl.
*H01L 31/00* (2006.01)
*H01L 31/054* (2014.01)
*H02S 40/22* (2014.01)

(52) U.S. Cl.
CPC ...... *H01L 31/0549* (2014.12); *H01L 31/0547* (2014.12); *H02S 40/22* (2014.12); *Y02E 10/52* (2013.01)

(58) Field of Classification Search
CPC ............ H01L 31/0543; H01L 31/0547; H01L 31/0549; H01L 31/0232; H01L 31/02327; H01L 31/054; H02S 40/20; H02S 40/22
See application file for complete search history.

(56) References Cited

U.S. PATENT DOCUMENTS 3,944,732 A * 3/1976 Kino ................. H04N 3/10
257/416
6,323,415 B1 11/2001 Uematsu et al.
2004/0123895 A1* 7/2004 Kardauskas ......... G02B 5/1861
136/244

(Continued)

FOREIGN PATENT DOCUMENTS

CN 101236998 A 8/2008
CN 201159021 Y 12/2008

(Continued)

OTHER PUBLICATIONS

Search Report for International Application No. PCT/KR2013/001729.

(Continued)

*Primary Examiner* — Eli Mekhlin
(74) *Attorney, Agent, or Firm* — LRK Patent Law Firm

(57) ABSTRACT

A solar cell apparatus includes a substrate having a transmission area and a non-transmission area adjacent to the transmission area, a solar cell disposed at the non-transmission area on the substrate, and a lattice pattern disposed at the transmission area on the substrate.

4 Claims, 2 Drawing Sheets

(56) References Cited

U.S. PATENT DOCUMENTS

| | | | | |
|---|---|---|---|---|
| 2007/0256733 A1* | 11/2007 | Karakida | ........ | H01L 31/022425 |
| | | | | 136/256 |
| 2009/0097522 A1* | 4/2009 | Justice | ................ | H01S 5/18386 |
| | | | | 372/50.11 |
| 2009/0178704 A1* | 7/2009 | Kalejs | ............... | B32B 17/10743 |
| | | | | 136/246 |
| 2009/0266413 A1* | 10/2009 | Mathai | ............ | H01L 31/022408 |
| | | | | 136/256 |
| 2012/0027348 A1* | 2/2012 | Fattal | ..................... | H01S 5/146 |
| | | | | 385/37 |

FOREIGN PATENT DOCUMENTS

| | | |
|---|---|---|
| CN | 201687353 U | 12/2010 |
| CN | 202090782 U | 12/2011 |
| JP | 2000-101124 A | 4/2000 |
| JP | 2010-092899 A | 4/2010 |
| JP | 2010-287688 A | 12/2010 |
| KR | 10-2009-0059529 A | 6/2009 |
| KR | 10-2010-0010255 A | 2/2010 |

OTHER PUBLICATIONS

KIPO Office Action for Korean Patent Application No. 10-2012-0022315 which corresponds to the above-identified U.S. application.

\* cited by examiner

[Fig. 1]
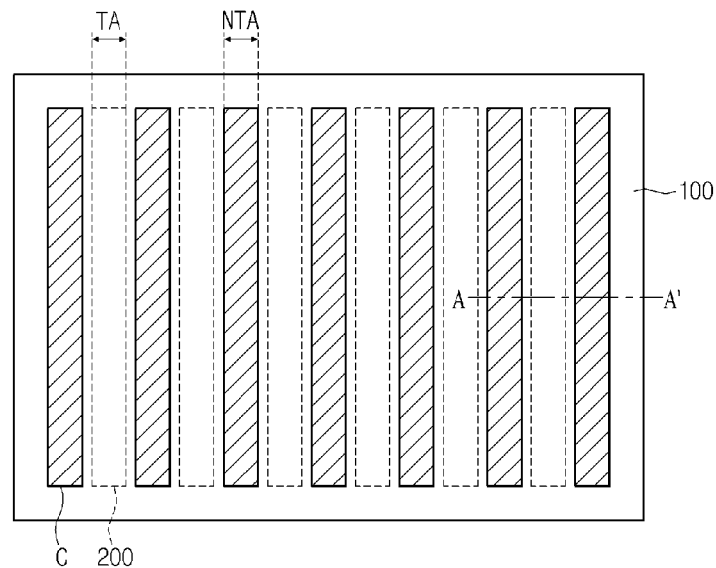
[Fig. 2]
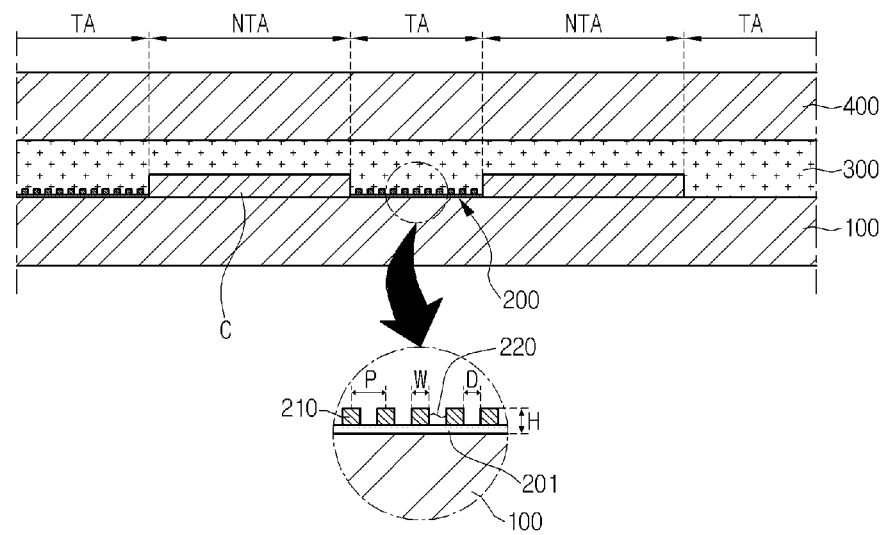
[Fig. 3]
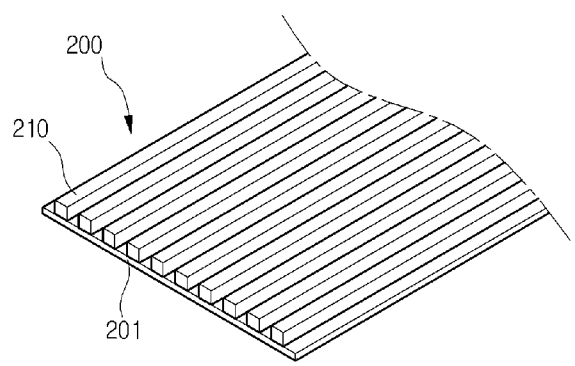

[Fig. 4]
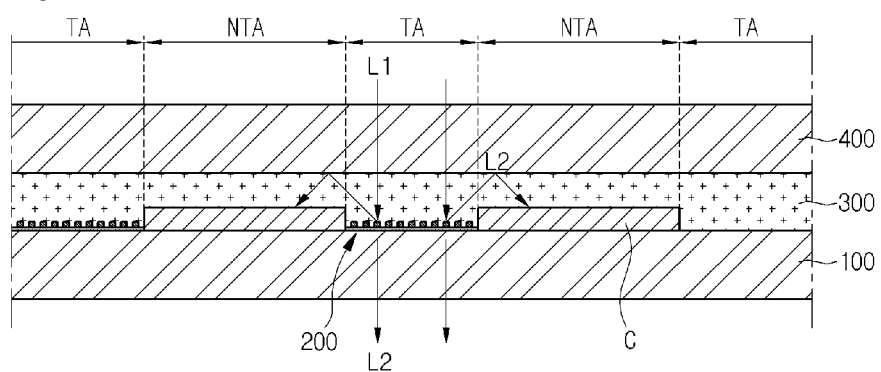

SOLAR CELL APPARATUS

TECHNICAL FIELD

The embodiment relates to a solar cell apparatus.

BACKGROUND ART

A solar cell apparatus for converting sunlight into electrical energy includes a solar cell panel, a diode, and a frame.

The solar cell panel has a plate shape. For example, the solar cell panel has a rectangular plate shape. The solar cell panel is disposed inside the frame. Four side surfaces of the solar cell panel are disposed inside the frame.

The solar cell panel receives sunlight, and converts the sunlight into electrical energy. The solar cell panel includes a plurality of solar cells. The solar cell panel may further include a substrate, a film, or protective glass for protecting the solar cells.

The solar cell panel includes bus bars connected to the solar cells. The bus bars extend from upper surface of outermost solar cells and are connected to wires, respectively.

The diode is connected to the solar cell panel in parallel. A current selectively flows through the diode. That is, when a performance of the solar cell panel deteriorates, a current flows through the diode. Accordingly, a short circuit of the solar cell apparatus according to the embodiment is prevented. The solar cell apparatus may further include wires connected to the diode and the solar cell panel. The wires connect solar cell panels adjacent to each other.

The frame accommodates the solar cell panel therein. The frame is made of a metal. The frame is disposed on a side surface of the solar cell panel. The frame accommodates a side surface of the solar cell panel therein. The frame may include a plurality of sub-frames. In this case, the sub-frames may be connected to each other.

Such a solar cell apparatus is mounted in the outdoor field to convert sunlight into electrical energy. Thus, the solar cell apparatus may be exposed to the external physical impact, electric impact and chemical impact.

A technology related to such a solar cell apparatus is disclosed in Korean Unexamined Patent Publication No. 10-2009-0059529.

DISCLOSURE OF INVENTION

Technical Problem

The embodiment provides a solar cell apparatus having improved photoelectric conversion efficiency.

Solution to Problem

According to the embodiment, there is provided a solar cell apparatus including: a substrate where a transmission area and a non-transmission area adjacent to the transmission area are defined; a solar cell disposed at the non-transmission area on the substrate; and a lattice pattern disposed at the non-transmission area.

According to the embodiment, there is provided solar cell apparatus including: a substrate where a plurality of transmission areas and a plurality of non-transmission areas adjacent to the transmission areas are defined; a plurality of solar cells disposed at the non-transmission areas on the substrate, respectively; and a polarizing part disposed at the non-transmission areas.

Advantageous Effects of Invention

According to the solar cell apparatus of the embodiment, the lattice pattern or the polarization part are disposed at the transmission area. Accordingly, the lattice pattern or the polarization part can transmit a part of light incident into the transmission area and reflect the remaining part of light. The reflected remaining part of light may be incident into the solar cell apparatuses.

The solar cell apparatus according to the embodiment is applicable to windows and doors of a building. In this case, the part of the light incident into the transmission area can be used for lighting inside the building by passing through the lattice pattern or the polarization part. Further, persons inside the building can view the external scenery through the transmission area.

The other part of the light incident into the transmission area is reflected by the lattice pattern or the polarization part, and the reflected light is incident into the solar cells. Accordingly, a greater amount of light can be incident into the solar cells due to the lattice pattern or the polarization part.

Thus, the solar cell apparatus according to the embodiment may have the improved photoelectric conversion efficiency.

BRIEF DESCRIPTION OF DRAWINGS

FIG. 1 is a plan view showing a solar cell apparatus according to the embodiment.

FIG. 2 is a sectional view taken long line A-A' of FIG. 1.

FIG. 3 is a perspective view illustrating a lattice pattern.

FIG. 4 is a view showing a path of light incident into a transmission area according to the embodiment.

MODE FOR THE INVENTION

In the description of the embodiments, it will be understood that, when a panel, a bar, a frame, a substrate, a recess, or a film is referred to as being "on" or "under" another panel, bar, frame, substrate, recess, or film, it can be "directly" or "indirectly" on the other panel, bar, frame, substrate, recess, or film, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

FIG. 1 is a plan view showing a solar cell apparatus according to the embodiment. FIG. 2 is a sectional view taken long line A-A' of FIG. 1. FIG. 3 is a perspective view illustrating a lattice pattern. FIG. 4 is a view showing a path of light incident into the transmission area according to the embodiment.

Referring to FIGS. 1 to 4, the solar cell apparatus according to the embodiment includes a support substrate 100, a plurality of solar cells C, a plurality of reflection-transmission parts 200, a buffer sheet 300, and a protective substrate 400.

The support substrate 100 has a plate shape, and supports the solar cells C and the reflection-transmission parts 200.

The support substrate 100 may be an insulator. The support substrate 100 may be a glass substrate or a metal substrate. In detail, the support substrate 100 may be a soda lime glass substrate. The support substrate 100 may be transparent. The support substrate 100 may be rigid or flexible.

The solar cells C are disposed on the support substrate 100. In detail, the solar cells C are disposed on a top surface of the support substrate 100. In more detail, the solar cells C may be directly disposed on a top surface of the support substrate 100.

The solar cells C extend in a first direction. The solar cells C extend in parallel to each other. The solar cells C are spaced apart from each other by a predetermined interval. That is, the solar cells C may be provided in the form of a stripe.

The solar cells C may convert incident sunlight into electrical energy. The solar cells C may be connected to each other in parallel. In detail, the solar cells C may be connected to each other in parallel through a first bus bar and a second bus bar.

For example, the solar cells C may include a CIGS solar cell, a silicon-based solar cell, a dye-sensitized solar cell, a group II-VI compound semiconductor solar cell, or a group III-V compound semiconductor solar cell.

In more detail, each of the solar cells C may include a back electrode, a light absorbing part, a buffer, a high resistance buffer, and a front electrode.

The back electrode is provided on the support substrate 100. The back electrode is a conductive layer. For example, a material use for the back electrode may include metal such as molybdenum (Mo).

The back electrode may include at least two layers. In this case, at least two layers may be formed by using the same metal or different metals.

The light absorbing part is provided on the back electrode. The light absorbing part may include group I-III-VI compounds. For instance, the light absorbing part may include the $Cu(In,Ga)Se_2$ (CIGS) crystal structure, the $Cu(In)Se_2$ crystal structure, or the $Cu(Ga)Se_2$ crystal structure.

The energy band gap of the light absorbing part may be in the range of about 1 eV to 1.8 eV.

The buffer is provided on the light absorbing part. The buffer directly makes contact with the light absorbing part. The buffer may include cadmium sulfide (CdS). The buffer may have the energy bandgap in the range of about 1.9 eV to about 2.3 eV.

The high-resistance buffer is disposed on the buffer. The high-resistance buffer includes i-ZnO, which is not doped with impurities. The high-resistance buffer may have the energy bandgap in the range of about 3.1 eV to about 3.3 eV.

The front electrode may be provided on the light absorbing part. In detail, the front electrode is provided on the high-resistance buffer.

The front electrode is disposed on the high-resistance buffer. The front electrode is transparent. For example, a material used as the front electrode may include an aluminum doped zinc oxide (AZO), an indium zinc oxide (IZO), or an indium tin oxide (ITO).

The front electrode may have a thickness in the range of about 500 nm to about 1.5 μm. The front electrode includes the AZO, the aluminum (Al) may be doped at the amount of about 1.5 wt % to about 3.5 wt %. The front electrode is a conductive layer.

Each of the solar cells C may include sub-solar cells which are connected to each other in series.

The support substrate 100 is defined by a plurality of transmission areas TA and a plurality of non-transmission areas NTA through the solar cells C.

The transmission areas TA are provided between the solar cells C. The solar cells C are not disposed at the transmission areas TA. Light is transmitted through the transmission areas TA.

The non-transmission areas NTA correspond to the solar cells C. That is, the solar cells C are disposed at the non-transmission areas NTA, respectively. The light is not transmitted through the non-transmission areas NTA.

The transmission areas TA and the non-transmission areas NTA may be alternately disposed. The transmission areas TA and the non-transmission areas NTA may have a shape extended in a first direction.

That is, the transmission areas TA and the non-transmission areas NTA may be provided adjacent to and in parallel to each other. In addition, a first bust bar may be disposed at one end of the solar cells C and a second bus bar may be disposed at the other end of the solar cells C.

The first bust bar extends in a direction crossing the solar cells C. The first bus bar extends in a second direction crossing the first direction. The first bus bar may be disposed corresponding to the one end of the solar cells C.

The first bus bar is connected to the solar cells C. In detail, the first bus bar is coupled to the solar cells C. In more detail, the first bus bar is connected to back electrodes of the solar cells C. The first bus bar is coupled to the solar cells C through parts of the back electrodes exposed to the outside. The first bus bar may directly make contact with the back electrodes. In detail, the first bus bar may be directly bonded to an exposed top surface of the back electrodes of the solar cells C through a solder process.

The first bus bar is connected to one end of the solar cells C. The first bus bar may extend to a rear surface of the support substrate 100 through a hole which is formed at the support substrate 100.

The second bus bar extends in a direction crossing the solar cells C. The second bus bar extends in a second direction crossing the first direction. The second bus bar may be disposed corresponding to the other end of the solar cells C.

The second bus bar is connected to the solar cells C. In detail, the second bus bar is coupled to the solar cells C. In more detail, the second bus bar is connected to front electrodes of the solar cells C. The second bus bar is coupled to the solar cells C through connection electrodes 210 and a connection part 700. The second bus bar may directly make contact with the connection electrodes 210. In detail, the second bus bar may be directly bonded to an exposed top surface of the connection electrodes 210 through the solder process.

The second bus bar is connected to one end of the solar cells C. The second bus bar may extend to a rear surface of the support substrate 100 through the hole which is formed at the support substrate 100.

The first bus bar and the second bus bar include a conductor. The first bus bar and the second bus bar may be a metal ribbon. The first bus bar and the second bus bar may include a conductive paste. The first bus bar and the second bus bar may be a conductive tape.

The reflection-transmission parts 200 are disposed on the support substrate 100. The reflection-transmission parts 200 are disposed on a top surface of the support substrate 100. The reflection-transmission parts 200 may be directly disposed on the top surface of the support substrate 100.

The reflection-transmission parts 200 are disposed at the transmission areas TA, respectively. The reflection-transmission parts 200 may be disposed over the whole area of the transmission areas TA. The reflection-transmission parts 200 are disposed between the solar cells C. The reflection-transmission parts 200 are disposed aside the solar cells C. The reflection-transmission parts 200 may be aligned on the same plane with the solar cells C. The reflection-transmission parts 200 are provided adjacent to the solar cells C. The reflection-transmission parts 200 and the solar cells C are alternately disposed.

The reflection-transmission parts 200 may transmit a part of light incident into the transmission areas TA and reflect a remaining part of light. In detail, the reflection-transmission parts 200 may transmit light polarized in a predetermined direction and reflect light polarized in the other direction. For example, the reflection-transmission parts 200 may reflect a primary wave and transmit a secondary-wave among the light incident into the transmission areas TA. That is, the reflection-transmission parts 200 may include a polarizing part transmitting only light polarized in a predetermined direction.

The reflection-transmission parts 200 may reflect the other part of the light incident into the transmission areas TA to a direction closer to the lateral direction. Particularly, the reflection-transmission parts 200 may reflect the other part of the light incident into the transmission areas TA to a direction approximately horizontal to a top surface of the support substrate 100. That is, the reflection-transmission parts 200 may reflect the other part of the light incident into the transmission areas TA at a reflection angle greater than the incident angle. For example, the reflection-transmission parts 200 may reflect the primary wave among the light incident into the transmission areas TA closer to the lateral direction.

As shown in FIGS. 2 and 3, the reflection-transmission parts 200 include a lattice pattern 210. The lattice pattern 210 may have a shape extended in a first direction. In detail, the lattice pattern 210 may have a bar shape. A transmission groove 220 may be formed at the lattice pattern, and light may be transmitted through the transmission groove 220.

The transmission groove 220 may have a shape extended in the first direction. The light incident into the transmission areas TA may be partially transmitted through the transmission groove 220.

The width of the lattice pattern 210 may be in the range of about 50 μm to about 200 μm. The height H of the lattice pattern 210 may be in the range of about 50 nm to about 200 nm. The pitch P of the lattice pattern 210 may be in the range of about 75 nm to about 300 nm. In detail, the pitch P of the lattice pattern 210 may be in the range of about 50 nm to about 200 nm. The distance D of the transmission groove 220 may be in the range of about 25 nm to about 100 nm.

In more detail, the width of the lattice pattern 210 may be in the range of about 50 μm to about 200 μm, the height H of the lattice pattern 210 may be in the range of about 50 nm to about 200 nm, the pitch P of the lattice pattern 210 may be in the range of about 75 nm to about 300 nm, and the distance D of the transmission groove 220 may be in the range of about 25 nm to about 100 nm.

When the lattice pattern 210 has the foregoing width W, height H, and/or pitch P, the lattice pattern 210 may transmit only the light polarized in a predetermined direction. That is, in this case, the lattice pattern 210 may perform a polarizing function.

The lattice pattern 110 may be transparent or opaque. For example, a material used for the lattice pattern 210 may include metal such as aluminum. In addition, the lattice pattern 210 may include a metal compound such as an aluminum compound or polymer such as polyimide.

A bonding part 210 may be interposed between the reflection-transmission parts 200 and the support substrate 100. The bonding part 201 may be formed on an entire top surface of the support substrate 100. For example, a material used for the bonding part 210 may include a photo-curable resin. The boding part 201 may be transparent.

The lattice pattern 210 is disposed on a top surface of the boding part 201. The lattice pattern 210 is bonded on the top surface of the bonding part 210. The lattice pattern 210 may be bonded to the support substrate 100 through the bonding part 201.

The buffer sheet 300 is disposed on the solar cells C and the reflection-transmission parts 200. The buffer sheet 300 is disposed on the support substrate 100, and covers the solar cells C and the reflection-transmission parts 200.

The buffer sheet 300 may be transparent and resilient. An example of a material used for the buffer sheet 300 may include ethylene vinyl acetate (EVA).

The buffer sheet 300 is interposed between the support substrate 100 and the protective substrate 400. The buffer sheet 300 may perform a mechanically and optically buffering function between the support substrate 100 and the protective substrate 400.

The protective substrate 400 is disposed on the buffer sheet 300. The protective substrate 400 faces the support substrate 100. The protective substrate 400 protects the solar cells C. An example of a material used as the protective substrate 400 may include reinforced glass.

The protective substrate 400 adheres on a top surface of the support substrate 100 through the buffer sheet 300. That is, the protective substrate 400 may be laminated to the tope surface of the support substrate 100 through the buffer sheet 300.

As shown in FIG. 4, a part of the light incident into the transmission area TA is transmitted through the reflection-transmission parts 200. Further, a remaining part of the light incident into the transmission areas TA is reflected by the reflection-transmission parts 200. For example, the reflection-transmission parts 200, in detail, the lattice pattern 210 may transmit a secondary-wave and reflect a primary wave among the light incident into the transmission areas TA.

Particularly, the other part of the light incident into the transmission areas TA may be reflected closer to a lateral direction, for example, the lateral upward direction by the reflection-transmission parts 200. Accordingly, the light reflected by the reflection-transmission parts 200 may be reflected from a bottom surface of the protective substrate 400 and incident into the solar cells C.

That is, the solar cell apparatus according to the embodiment reflects the remaining part of the light incident into the transmission areas TA and provides the reflected light to the solar cells C. Further, the solar cell apparatus according to the embodiment partially transmits the light incident into the transmission areas TA. Accordingly, when the solar cell apparatus according to the embodiment is used for windows or doors, external scenery can be easily viewed.

Therefore, the solar cell apparatus according to the embodiment may be used for windows and doors of a building and convert a part of sunlight incident into the transmission areas TA into electrical energy. As a result, the solar cell apparatus according to the embodiment may be used for windows and doors and may represent high photoelectric conversion efficiency.

Further, the features, structures, and effects described in the above embodiments are included in at least one embodiment of the present invention, and are not necessarily limited to only one embodiment. Moreover, the features, structures, and effects described in the embodiments may also be combined or modified to be carried out in other embodiments by those skilled in the art to which the embodiments pertain. Thus, the contents related to the combination and modification shall be construed to be included in the scope of the present invention.

Although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar cell apparatus comprising:
    a substrate having a transmission area and a non-transmission area adjacent to the transmission area;
    a solar cell disposed at the non-transmission area on the substrate; and
    a reflection transmission part disposed at the transmission area on the substrate, and including a plurality of bar-shaped lattice patterns extended in a first direction and a plurality of transmission grooves for separating the lattice patterns from each other;
    a transparent, resilient buffer sheet layer formed to correspond to a shape of the solar cell, the lattice patterns and the transmission grooves to cover the solar cell and the reflection transmission part,
    wherein the buffer sheet layer comprises ethylene vinyl acetate (EVA),
    wherein the reflection transmission part and the solar cell are alternatively disposed to not overlap each other,
    wherein the solar cell and the lattice patterns of the reflection transmission part are bonded to the substrate by a bonding part,
    wherein the solar cell and the lattice patterns are disposed on a same surface of the substrate,
    wherein a depth of each of the transmission grooves is equal to a height of each of the lattice pattern,
    wherein the height of each of the lattice patterns is lower than a height of the solar cell,
    wherein a pitch of the lattice patterns is in a range of 75 nm to 300 nm, and
    wherein the transmission area has a shape extended in one direction, and the lattice patterns extend in a direction equal to the extension direction of the transmission area.

2. The solar cell apparatus of claim 1, wherein the height of the lattice pattern is in a range of 50 nm to 200 nm.

3. The solar cell apparatus of claim 1, wherein the lattice pattern comprises a metal, a metal compound, or a polymer.

4. The solar cell apparatus of claim 3, wherein the lattice pattern comprises aluminum.

* * * * *